(12) United States Patent
Moss

(10) Patent No.: US 6,356,111 B1
(45) Date of Patent: Mar. 12, 2002

(54) CROSSPOINT SWITCH ARRAY WITH BROADCAST AND IMPLIED DISCONNECT OPERATING MODES

(75) Inventor: William E. Moss, Sunnyvale, CA (US)

(73) Assignee: I-Cube, Inc., Campbell, CA (US)

( * ) Notice: Subject to any disclaimer, the term of this patent is extended or adjusted under 35 U.S.C. 154(b) by 0 days.

(21) Appl. No.: 09/735,430

(22) Filed: Dec. 12, 2000

(51) Int. Cl.$^7$ ............................................... H01L 25/00
(52) U.S. Cl. .............................. 326/41; 326/47; 326/39
(58) Field of Search ............................ 326/37, 38, 39, 326/41, 47

(56) References Cited

U.S. PATENT DOCUMENTS

| | | | | |
|---|---|---|---|---|
| 5,465,056 A | * | 11/1995 | Hsieh et al. | .................. 326/41 |
| 5,530,814 A | * | 6/1996 | Wong et al. | ................. 395/312 |
| 5,710,550 A | * | 1/1998 | Hsieh et al. | ........... 340/825.79 |

* cited by examiner

Primary Examiner—Michael Tokar
Assistant Examiner—Anh Q. Tran
(74) Attorney, Agent, or Firm—Daniel J. Bedell; Smith-Hill and Bedell

(57) ABSTRACT

A high-speed N×M crosspoint switch selectively routes input signals arriving at any of N input terminals to one or more of M output terminals through a switch cell array having N rows and M columns of switch cells, each for selectively providing a signal path between one input terminal and one output terminal. Each switch cell contains a first memory cell holding a data bit, a second memory cell holding a control bit, and a transistor for making or braking a signal path in response to the control bit. This switch cell architecture enables the crosspoint switch to operate in normal, implied disconnect and broadcast modes. In the normal mode a controller creates a routing pattern by writing data bits to the second memory cells and then signals all switch cells to transfer their data bits into the first memory cells. In the implied disconnect mode, when any cell of a column is signaled to make a path, all other cells along that column automatically break their paths. The broadcast mode allows the controller to quickly configure the array to broadcast a signal and then restore a previous routing pattern.

13 Claims, 3 Drawing Sheets

CROSSPOINT SWITCH ARRAY WITH BROADCAST AND IMPLIED DISCONNECT OPERATING MODES

BACKGROUND OF THE INVENTION

1. Field of the Invention

The present invention relates in general to crosspoint switch arrays and in particular to a rapid switching crosspoint array providing implied disconnect and broadcast capabilities.

2. Description of Related Art

FIG. 1 illustrates a typical prior art crosspoint array 10 for selectively routing any of four input signals IN(0)–IN(3) to any of four output terminals OUT(0)–OUT(3). Crosspoint array 10 includes four "horizontal" input lines H(0)–H(3), four "vertical" output lines V(0)–V(3), and sixteen switch cells S(0,0)–S(3,3). Each switch cell S(M,N) can selectively provide a signal path between the Mth input line H(M) and the Nth output line V(N) depending on the state of a control bit an array controller 12 writes into a memory cell within the switch cell S(M,N). For example to route input signal IN(0) to output line OUT(2) controller 12 sets a bit in switch cell S(0,2) to a "true" state so that the switch cell provides a signal path between input line H(0) and output line V(2). To thereafter break that signal path, controller 12 sets the bit in switch cell S(0,2) false.

Array controller 12 writes bits into the memory cells of the various switch cells S(M,N) in response to commands from an external host computer (not shown) requesting the controller to make or break particular routing paths through switch array 10. A separate pair of "bit lines" B(N) and B*(N) links controller 12 to the Nth column of switch cells S(0,N)–S(3,N), and a separate "row address" line R(M) links controller 12 to each Mth row of switch cells S(M,0)–S(M,3). For example, to turn on switch cell S(0,0), controller 12 drives the cell's B(0) bit line true, drives its B*(0) bit line false, and then pulses the R(0) line. To turn off switch cell S(0,0), controller 12 drives the B(0) line false, drives the B*(0) line true, and then pulses the R0 line. When controller 12 sets both of a cells bit lines false, the state of the cell's control bit remains unchanged when controller 12 pulses its row address line. For example, when controller 12 is writing a bit only to cell S(0,0), it keeps bit lines B(1)–B(3) and B*(1)–B(3) low so that the bits in cells S(0,1)–S(0,3) remain unchanged when controller 12 pulses row address line R(0).

FIG. 2 illustrates a typical implementation of switch cell S(0,0) of array 10 of FIG. 1; other switch cells are similar. Switch cell S(0,0) includes an S/R flip-flop 14 for storing the control bit. The Q output of flip-flop 14 drives the gate of a complementary metal oxide silicon (CMOS) pass transistor 18 linking the H(0) and V(0) lines. When the Q output of flip-flop 14 is high transistor 18 makes a signal path between H(0) and V(0) and when the Q output is low transistor 18 breaks that signal path. A logic circuit 15, driving the set (S) and reset (R) inputs of flip-flop 14, decodes the R(0), B(0) and B*(0) lines to determine when to set or reset the flip-flop.

Broadcasting

Switch array 10 can "broadcast" one input signal to more than one output line. For example, when control bits in all four switch cells S(0,N) of the top row are set true (where N=0 through 3) switch array 10 concurrently routes the IN(0) signal to all output terminals OUT(0)–OUT(3). Some controllers 12 can concurrently write control bits to all cells of a given row of switch cells at a time. For example to turn on all cells S(0,0)–S(0,3) of the top row at the same time so that input signal IN(0) is broadcast to every output terminal OUT(0)–OUT(3), controller 12 could drive all bit lines B(0)–B(3) true, drive all bit lines B*(0)–B*(0) false, and then pulse the R0 line. However to tell controller 12 how to set a bit in each cell S(M,N) along the Mth row, the controller's input command would have to convey a relatively large amount of information. In the example switch array 10 of FIG. 1, where M=N=4, a command would have at least two bits to indicate which of four array rows is to be write addressed and eight bits to indicate how controller 12 should set each of the eight bit lines B(0)–B(3) and B*(0)–B*(3). Thus a command would have to be at least 10 bits wide. In a larger M×N array, for example where M=N=512, such a command would have to include at least 1031 bits. Since 1031 bits would have to be applied serially to controlled 12, the time required to load such a command into the controller would substantially increase the time required for an external host computer to change signal brag routing through crosspoint array 10.

Some controllers 12 set control bits in only one switch cell at a time. Thus an input command to such a controller would reference the address of a single cell and indicate the state of its single control bit. Accordingly, an input command to a 512×512 controller 12 that only writes to one cell at a time would require 9 bits to identify the row of the cell, 9 bits to identify the column of the cell and one bit to specify the desired state of the cell's control bit. Since such a command would be only require a total of 19 bits, it could be loaded into controller 12 much quicker than a 1031 bit command of an 512×512 array controller that writes to an entire row.

However when operating a crosspoint array in a broadcast mode, a controller that can write to only one cell at a time requires many write cycles to reconfigure the array to carry out a broadcast. For example suppose array 10 is broadcasting input signal IN(0) to all output terminals and the host computer wants to switch it so that it broadcasts input signal IN(1) to all output terminals. To do so, the host computer would have to command controller 12 to set the control bit in each of the four switch cells of row 0 false and to set the control bit in each of the four switch cells of row 1 true. This would require 8 write cycles. In a 512×512 array, such an operation would require 1024 write cycles. While all these write operations are taking place, switch 10 is in various intermediate states wherein it "partially" broadcasts either the IN(0) and/or IN(1) signal. In many applications allowing the crosspoint array to exist in such intermediate states can be problematic.

Therefore what is needed is a crosspoint array and controller architecture that allows the controller to setup a broadcast in only a single write cycle in response to a short command.

In many applications, such as for example in network routing switches, input signals "compete" for paths to output terminals. When one input signal is broadcast to all output terminals, all other traffic through the crosspoint array must temporarily stop because the input signal being broadcast ties up all the output terminals. To temporarily carry out a broadcast, a conventional controller 12 would first have to set the control bits in all cells of one array row true and set the control bits in all other cells false. To resume normal traffic after the broadcast is complete, controller 12 would have to reprogram the entire array 10 to the state it was in prior to the broadcast. Thus not only would the processes of setting up a temporary broadcast and then returning array 10 to its previous routing state require a large number of write operations, it would also require the host computer sending commands to controller 12 to remember the switching state of all switch cells prior to the broadcast so that it could return them to those states following the broadcast.

Therefore what is also needed is a large crosspoint switch that can quickly switch to broadcast a signal and then quickly return to its previous routing state without requiring an external host computer to remember what that previous routing state was.

Disconnecting

While it is possible for crosspoint array 10 to concurrently forward more than one of input signals IN(0)–IN(3) to the same one of output terminals OUT(0)–OUT(3), such a routing configuration is considered "illegal" in most applications. Hence while more than one switch cell S(M,N) of any given row M can be turned on at the same time to broadcast an input signal to several outputs, in most applications only one switch cell of any given column N is allowed to be turned on at the same time. Assume, for example, that switch S(1,1) is currently routing input signal IN(1) to output terminal OUT(1), and suppose that an external host computer wishes to reconfigure array 10 so that it routes input signal IN(3) to output terminal OUT(1). To do that the host computer must command controller 12 to first set the internal control bit of switch cell S(1,1) false so that it no longer provides a signal path for IN(1) to output terminal OUT(1). The host computer must then command controller 12 to set the bit in switch cell S(3,1) true so that array 10 will begin routing input signal IN(3) to output terminal OUT(1). One drawback to this operation is that it takes two commands and two write cycles to turn off cell S(1,1) and one to turn on cell S(3,1).

What is also needed is an improved crosspoint array wherein a single, relatively small input command can tell controller 12 to quickly switch from broadcasting one signal to broadcasting another.

BRIEF SUMMARY OF THE INVENTION

An N×M crosspoint switch in accordance with the invention routes input signals from any of N input terminals to one or more of M output terminals in response to control signals from a controller indicating desired signal paths between the input and output terminals. The crosspoint switch includes N drivers, M receivers, and a switch cell array having N rows and M columns of switch cells. Each of the N drivers buffers a separate one of the input signals arriving at an input terminal into the crosspoint switch array and each of the M receivers buffers an array output signal onto a separate one of the output terminals. Each switch cell of the crosspoint array includes a pass gate transistor for selectively making or breaking a signal path between one of the input terminals and one of the output terminals of the array in response to the control signals.

In accordance with one aspect of the invention, each switch cell includes a first memory cell for storing a data bit, a second memory cell for storing a control bit, and a logic circuit. The control bit sets the state of the switch cell's transistor to make or break the signal path between the cell's input line and the output line. The control signals can tell the logic circuit to set either the data bit or the control bit to a particular state and can tell the logic circuit to transfer the data bit from the first memory cell to the second memory cell.

In a normal mode of operation, to reconfigure the routing paths through the array, the controller writes data bits to first memory cells of one or more of the switch cells. It then signals the logic circuits of all switch cells to concurrently transfer the data bit from the first memory cell into the second memory cell, thereby reconfiguring the routing paths.

In a prior art crosspoint switch array, the process of reconfiguring the array's routing paths takes place sequentially, with the controller making or breaking one path at a time. During the time required to sequentially reconfigure several routing paths, for example when switching between two large parallel buses, the prior art array passes through a series of undesirable intermediate routing states during which no transmissions can take place on any of the buses being switched. By initially sequentially writing all path configuration data into the first memory cells (which has no immediate effect on the array's signal routing paths) and then concurrently transferring the routing data from all first memory cells to all second memory cells, the array of the present invention can quickly switch from one desired routing pattern to another without having to pass through any unwanted routing patterns.

In accordance with another aspect of the invention, the crosspoint switch includes an implied disconnect mode of operation. In the implied disconnect mode, whenever the control signals tell the logic circuit of any particular cell along an Mth column of the array to make a signal path to the Mth output terminal, each other cell of the Mth column currently providing a signal path to the Mth output terminal automatically breaks that signal path. This prevents the controller from having to use an additional write cycle to tell each other cell to break its signal path.

In accordance with a further aspect of the invention, the crosspoint switch also includes a broadcast mode of operation wherein the controller concurrently tells the logic circuits of all M cells along an Nth row of the array to form signal paths to all M outputs terminals so that the Nth input signal can be broadcast to all output terminals. The controller does this by telling the logic circuits of the Nth row to directly write to the second memory cell. This alters the control bit in the second memory cell to immediately create a signal path, but leaves the data bit in the first memory cell unchanged. At the same time, the logic circuits of all other switch cells set the control bits in their second memory cells to break their signal paths. Thus the array is quickly configured in one write cycle to carry out the broadcast operation. But, the first memory cells continue to store data defining the array's prior routing pattern. Thereafter, the controller can restore the array to the prior signal routing pattern by signaling the logic circuit in all switch cells to transfer the data bits stored in all first memory cells into all second memory cells in a single write operation.

It is accordingly an object of the invention to provide a crosspoint switch that can rapidly switch between routing patterns without passing though intermediate patterns.

It is another object of the invention to provide a crosspoint switch capable of automatically disconnecting any existing path to an output terminal whenever making a new path to that output terminal.

It is accordingly a further object of the invention to provide a crosspoint switch capable of rapidly setting up a signal broadcast and thereafter quickly return to a previous routing pattern.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

DETAILED DESCRIPTION OF THE INVENTION

Figure 3:
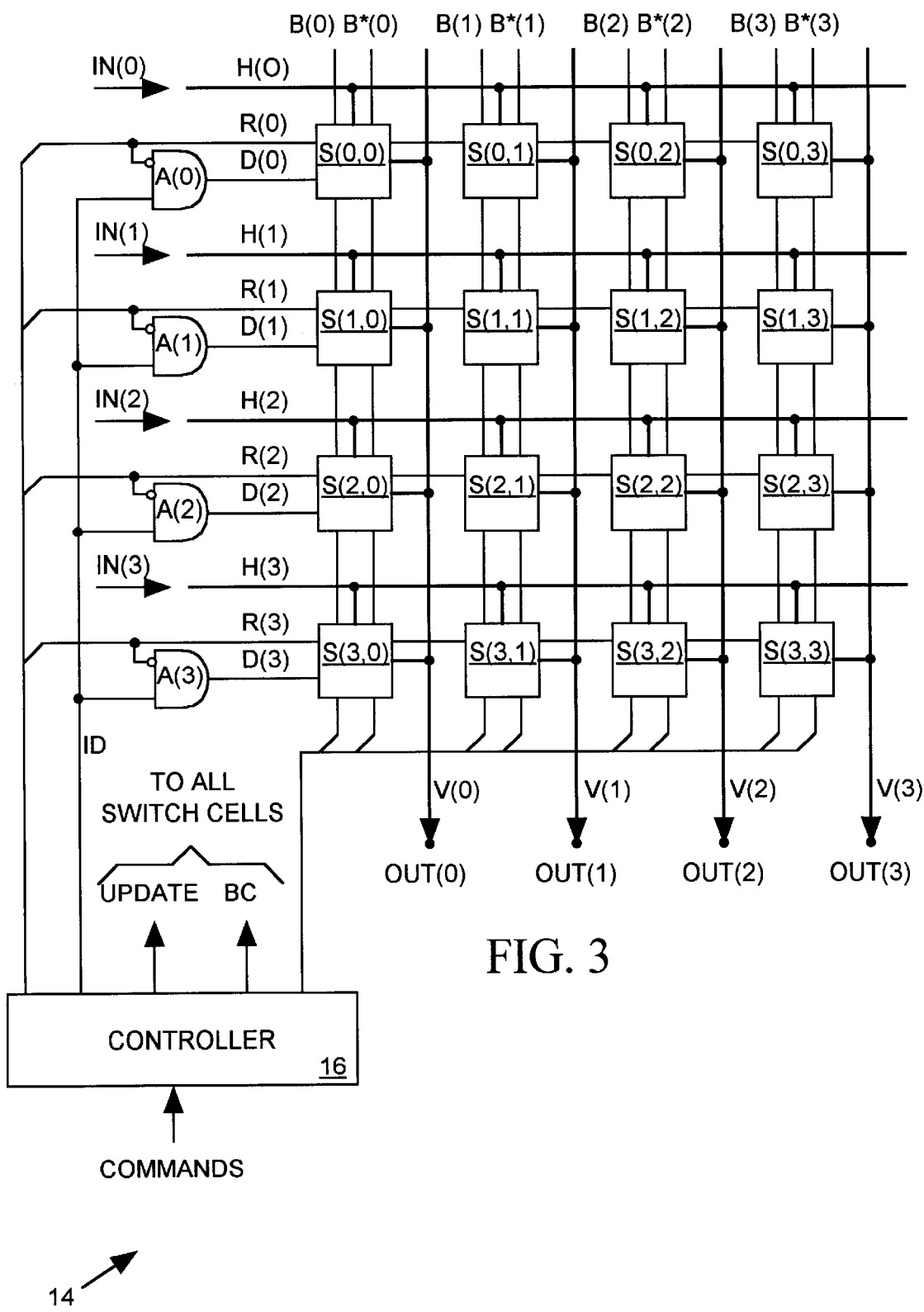
FIG. 3 illustrates in block diagram form a crosspoint switch in accordance with the invention.

FIG. 3 illustrates a 4×4 crosspoint array 14 for selectively routing a set of input signals IN(0)–IN(3) to a set of output terminals OUT(0)–OUT(3). Switch array 14 includes a set of four input lines H(0)–H(3) for receiving input signals IN(0)–IN(3), a set of four output lines V(0)–V(3) coupled to output terminals OUT(0)–OUT(3), and an array of 16 switch cells S(0,0)–S(3,3). A controller 16 can signal each switch cell S(M,N) at the intersection of the Mth input line H(M) and the Nth output line V(N) to provide a signal path between the input line H(M) and the output line V(N) so that it routes the Mth input signal IN(M) to the Nth output terminal OUT(N). Controller 16 may also signal the switch cell S(M,N) to break its path so that the input signal H(M) no longer passes to output terminal H(N). Controller 16 signals switch cells S(0,0)–S(3,3) to make or break their signal paths in response to routing commands from an external host computer (not shown).

Controller 16 uses a set of "bit" lines B(0)–B(3) and B*(0)–B*(3), a set of "row address" lines R(0)–R(3), and a pair of control lines (UPDATE and BC) to communicate with the switch cells. The Mth row address line R(M) links controller 16 to the Mth row of switch cells S(M,0)–S(M,3) while the Nth pair of bit lines B(N) and B*(N) connect controller 16 to each switch cell S(0,N)–S(3,N) of the Nth columns. The UPDATE and BC control lines are connected in parallel to all switch cells.

Figure 4:
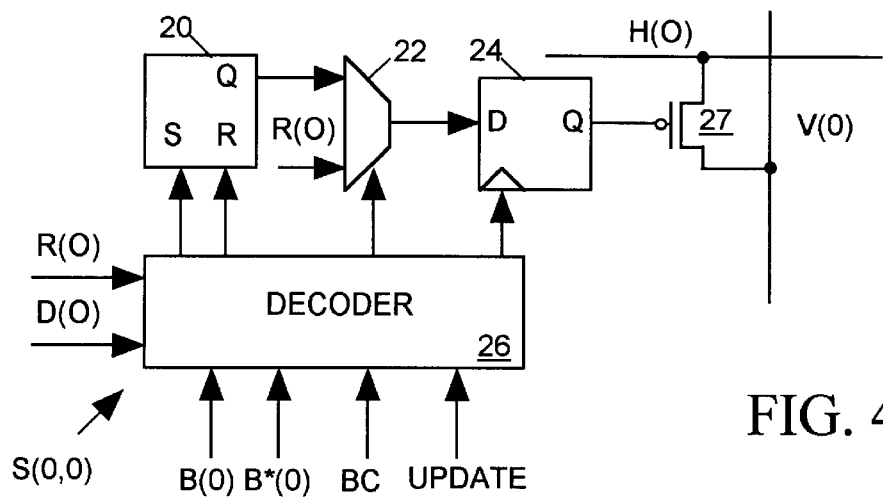
FIG. 4 illustrates one of the switch cells of the crosspoint switch of FIG. 3 in accordance with the invention in more detailed block diagram form.

FIG. 4 illustrates switch cell S(0,0) of FIG. 3 in more detailed block diagram form; other switch cells of FIG. 3 are similar. Switch cell S(0,0) includes a first memory cell (preferably an S/R flip-flop 20) for storing a data bit, a second memory cell (preferably a type D flip-flop 24) for storing a control bit, a multiplexer 22, a decoder 27 and a CMOS pass transistor 27. When pass transistor 27 is on, it provides a signal path between input line H(0) and output line V(0) through its channel. Since the Q output of flip-flop 24 controls the gate of transistor 27, the state of flip-flop 24 controls whether pass transistor 27 makes or breaks its signal path. The output of multiplexer 22, controlled by decoder, drives the D input of flip-flop 24. The Q output of flip-flop 20 drives one input of multiplexer 22 while row address line R(0) drives a second input of the multiplexer. Decoder 27 enables flip-flop 24 and controls the set (S) and reset (R) inputs of flip-flop 20 by decoding various combinations of control signals arriving on input R(0), D(0), B(0), B*(0), BC and UPDATE control lines.

In accordance with the invention, the switch cell architecture illustrated in FIG. 4 enables crosspoint array 14 to operate in any of three modes, a "normal" mode, an "implied disconnect" mode, and a "broadcast" mode. Each mode is described in detail below.

Normal Mode

Referring to FIGS. 3 and 4, in its normal mode of operation, each input command to controller 16 tells it signal a single cell S(M,N) to make or break a signal path between input line H(M) and output line V(N). In the normal mode, decoder sets multiplexer 22 to pass the Q output of flip-flop 20 to the D input of flip-flow 24. To signal the cell S(M,N) to make a signal path, controller 16 drives bit line B(N) high and drives all other bit lines low, and then strobes (sends a control pulse on) row address line R(M). This causes decoder 27 to set flip-flop 20. Controller 16 then pulses the UPDATE signal to tell the logic circuit 26 in all cells to clock the local flip-flop 24, thereby loading the Q output of flip-flop 20 into flip-flop 24. Controller 16 follows the same procedure to signal cell S(M,N) to break a signal path, except that it initially drives bit line B*(N) high and drives all other bit lines low.

For example, to route input signal IN(1) to output terminal OUT(3), the host computer must command controller 16 to signal switch cell S(1,3) to establish a path between input line H(1) and output line V(3). To do so controller 16 first sets B(3) true and all other bit lines B(0)–B(2) and B*(0)–B*(3) false, strobes row address line R(1) to set flip-flop 20 of cell S(M,N), and then strobes the UPDATE line to transfer a control bit into the cell's flip-flop 24. Although all other switch cells also clock their flip-flops 24, the states of those flip-flops do not change because the bits at their D inputs have not changed. When the host computer thereafter commands controller 16 to break the connection, the controller sets the B*(3) bit line true, sets all other bit lines false, and then again strobes row address line R(1) and then the UPDATE line.

Figure 1:
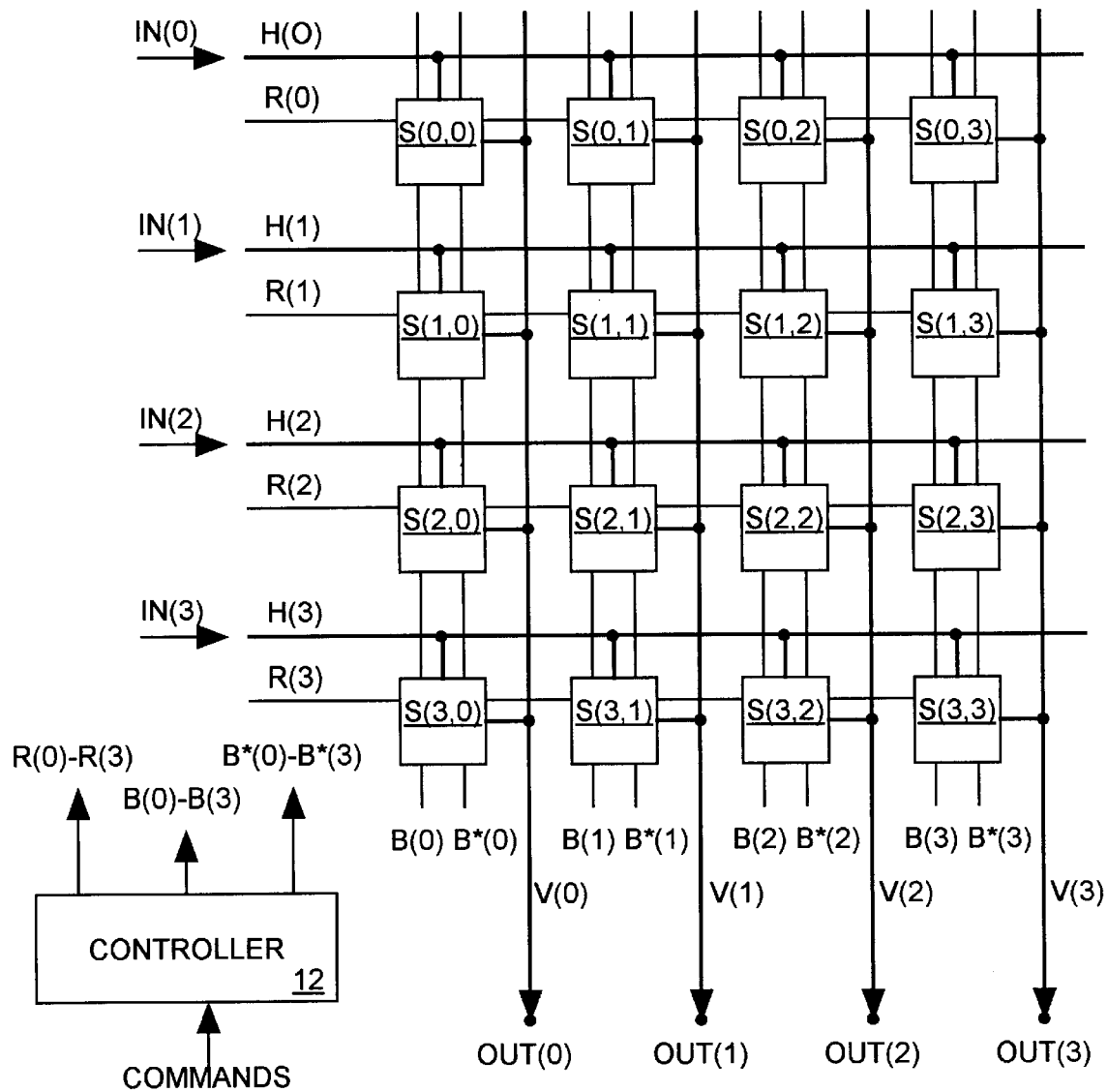
FIG. 1 illustrates a prior art crosspoint switch in block diagram form.
Figure 2:
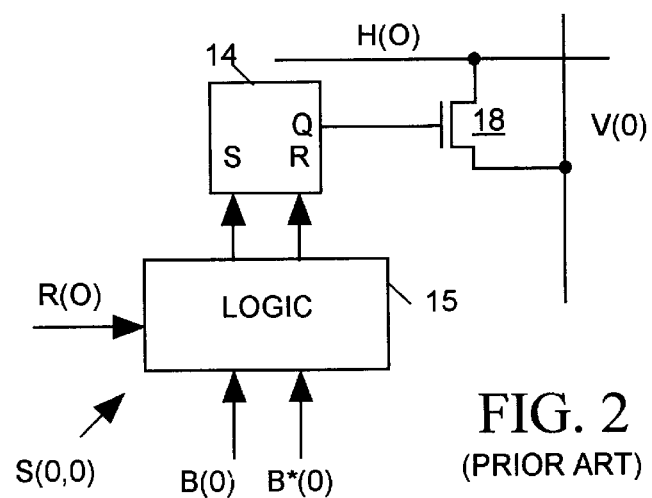
FIG. 2 illustrates one of the switch cells of the crosspoint switch of FIG. 1 in more detailed block diagram form.

One advantage to the switch cell architecture of FIG. 4 over the prior art switch cell architecture of FIG. 2 is that it allows controller 16 to tell more than one switch cell S(M,N) whether it is to make or break a signal path (by setting or resetting the flip-flop 20 of each of those cells in turn) and to thereafter cause all such switch cells make or break their paths concurrently by pulsing the UPDATE signal. By signaling all such cells to change their routing paths at the same time, the switch array avoids having to pass though several intermediate routing stages. When a switch array employs the prior art switch cell architecture of FIG. 2, a controller capable of writing to only a single switch cell at a time has to change the actual switching state of each cell in turn, and that can lead to problematic intermediate switch array routing configurations in some applications.

Implied Disconnect Mode

In most applications it is not permissible to concurrently route more than one input signal IN(0)–IN(3) to the same one of output terminals V(0)–V(3). Hence it is necessary to break ("disconnect") a signal path between one input line and a given output line V(N) before making a signal path for another input signal to that same output line. Suppose, for example, crosspoint array 14 is currently routing input signal IN(1) to output terminal V(2) and an external host computer wants controller 16 to reconfigure array 14 so that it instead routes input signal IN(3) to output terminal V(2). In the normal mode of operation it would be necessary for the host computer to command controller 16 to first configure array 14 to break the signal path between input line H(1) and output line V(2). The host computer would then have to command controller 16 to configure array 14 to make a signal path between input line H(3) and output line V(2). This process is slow since the break/make operation requires two successive input commands and two successive array write operations.

However when controller 16 operates in an implied disconnect mode in accordance with the invention, and host computer commands the controller to make a routing path to any output terminal OUT(0)–OUT(3) and any existing routing path to that output terminal will be automatically broken. Thus in the implied disconnect mode, only a single command and a single array write operation is needed to break an existing path to any output terminal OUT(0)–OUT(3) and to make a new path to it. Any command to connect an input signal to an output terminal is an "implied" command to disconnect any other input signal from that output terminal.

When operating in the implied disconnect mode, controller 16 thereafter pulses an output implied disconnect line (ID) whenever it also pulses any one of address lines R(0)–R(3) during an array write operation. The ID line drives an input of each of four AND gates A(0)–A(3) while each row address line R(0)–R(3) drives an inverting input of a corresponding one of the AND gates. As illustrated in FIG. 4, the output "disconnect" signal D(M) of the Mth AND gate A(M) provides an additional control signal input to the decoder 27 of each switch cell S(M,0)–S(M,3) of the Mth array row.

In the array's normal mode of operation, controller 16 always holds the ID signal low and no pulse appears on any of disconnect signals D(0)–D(3) during write operations. A low disconnect signal D(M) tells the decoder 27 of each switch cell S(M,N) to operate the cell in its normal mode, setting or resetting flip-flop 20 in response to a pulse on the R(0) line if the B(N) and B*(N) are of opposite states. However when operating in the implied disconnect mode, controller 16 pulses the ID signal whenever it pulses any one of row address lines R(0)–R(3). In that case a pulse always appears in three out of four of the disconnect signals D(0)–D(3). For example when controller 16 pulses both the ID and R(1) signals to set the state of the flip-flop 20 of one of the switch cells along row 1, a pulse appears in each of disconnect signals D(0), D(2) and D(3). No pulse appears in the D(1) signal In the normal mode of operations, a pulse in the Mth row address signal R(M) tells the decoder 27 of each of the cells S(M,N) of the Mth array row to set the state of its internal control bit in accordance with the states of the bit lines B(N) and B*(N) for the Nth column. If the B(N) and B*(N) bit lines are of opposite states, indicating that a cell S(M,N) in column N is to make or break a signal path, then a pulse the Mth row address line R(M) tells cell S(M,N) of row M to set its internal control bit to make or break its connection. If the B(N) and B*(N) lines for column N are both true or both false, then a pulse on row address line R(M) has no effect on the state of the control bit stored in switch cell S(M,n).

In the implied disconnect mode of operation, a disconnect signal pulse D(M) tells each cell S(M,N) of the Mth row reset the local flip-flop 26 if, and only if B(M) is true and B*(M) is false. In other words, when the flip-flop of one switch cell along the Nth column is set, the flip-flops 20 of the remaining three cells S(M,N) along the Nth column are reset. Thereafter, when controller 16 pulses the UPDATE signal, one switch cell along the Nth column makes a signal path and any other switch cell along that column that may have been providing a signal path, breaks the signal path.

Hence in the implied disconnect mode, a command to connect an input signal IN(M) to a particular output terminal OUT(N) is also an "implied disconnect" command in that it causes the switch array to disconnect any other input signal from that particular output terminal.

Note that the implied disconnect system operates in a similar fashion when input signal are broadcast to the output terminals. For example when all cells S(1,0)–S(1,3) of array row are configured to provide signal paths, crosspoint switch 14 broadcasts input signal IN(1) to all output terminals OUT(0)–OUT(3). In the implied mode of operation, when the external host computer commands controller 16 to broadcast input signal IN(2) to all output terminals OUT(N), controller 16 sets all bit lines B(N) true, sets all bit lines B*(N) false, and concurrently pulses row address line R(2) and the ID control line. This causes all cells S(1,N) along row 1 to break their signal paths and causes all cells S(2,N) along row 2 to make their signal paths.

Broadcast Mode

Switch array 14 is capable of concurrently broadcasting any input signal IN(M) to all output terminals OUT(0)–OUT(3). For example, to broadcast input signal IN(0) to all output terminals OUT(0)–OUT(3), controller 16 has to break all pre-existing signal paths through array 14 for input signals IN(1)–IN(3) and then set all of the cells S(0,0)–S(0, 3) along the upper array row to route input signal IN(0) to the output terminals OUT(0)–OUT(3). In applications where input signals IN(0)–IN(3) "compete" for access to output terminals OUT(0)–OUT(3), switch array 14 can respond to a single input command to broadcast a particular input signal by temporarily breaking all signal path and configuring itself to broadcast that particular input signal. Thereafter in response to another input command, switch array can break the broadcast paths and restore the previously broken signal paths so that it can continue to route input signals as it was doing before being interrupted to handle the broadcast.

The input broadcast command need only identify the particular input signal IN(M) to be broadcast. Controller 16 responds to the command by driving a corresponding row address line R(M) high and then sending an broadcast signal BC pulse to every switch cell S(M,N) of array 14. Referring to FIG. 4, the decoder 27 of each switch cell responds to the BC pulse by temporarily switching multiplexer 22 to route the row address signal R(M) to the D input of flip-flop 24 and then clocking the flop-flop. Since the row address line R(M) for all switch cells S(M,N) of the Nth row is high, the flop-flops 24 of those cells drive their outputs high, thereby causing their pass gate transistors 27 to create signal paths between input line H(M) and all output lines V(0)–V(3). Since all another row address lines are low, the flip-flops 24 of cells of all other rows drive their Q outputs low, turning off their local transistors 27 to break any existing signal paths. Thus in a single write operation, controller 16 breaks all existing paths and configures array 14 for a broadcast.

Thereafter, in response to an input command signaling the end of the broadcast operation, controller 16 simply pulses the UPDATE signal. That tells the decoder 27 in every switch cell S(M,N) to set multiplexer 22 to link the Q of flip-flop 20 to the D input of flip-flop 24 and to clock flop-flop 24. This restores the flip-flop 24 of each switch cell (M,N) to its state prior to the broadcast operation. Thus controller 16 also needs only a single write cycle to restore the entire array 14 to it previous routing state.

Command Set

Each command that an external host computer may send to controller 16 includes an opcode referencing the nature of the command and include an operand when required. The various commands are described below.

WRITE: The write command tells controller 16 to set or reset a flip-flop 20 of a particular switch cell S(M,N). The command's operand includes row and column address fields referencing the switch cell's row address M and column address N, and a single bit data field indicating whether the switch cell's flip-flop 20 is to be set or reset.

WRITE$_{13}$ ID: The implied disconnect write command (write_ID) tells controller 16 to set or reset a flip-flop 20 of a particular switch cell S(M,N) and to reset the flip-flops 20 of all switch cells of the Nth column. The command's operand, similar to a write command operand, includes a row and column address fields referencing the switch cell's row address M and column address N, and a single bit data field indicating whether the switch cell's flip-flop 20 is to be set or reset.

UPDATE: The Update command, which requires no operand, tells controller 16 to send an UPDATE signal to all switch cells telling them to clock their internal flip-flops 24 to drive them to the same state as flip-flops 20.

QWRITE: The quick write command is similar to the write command in that it tells controller 16 to set or reset a flip-flop 20 of a particular switch cell S(M,N). However the quick write command also tells controller 16 to send an UPDATE signal to all switch cells immediately thereafter telling them to clock their internal flip-flops 24 to set them to the same sate as flip-flops 20.

QWRITE_ID: The implied disconnect quick write command is similar to the implied disconnect write command in that it tells controller 16 to set or reset a flip-flop 20 of a particular switch cell S(M,N) and to thereafter transmit an UPDATE signal to all switch cells. However the implied disconnect quick write command also tells controller 16 to reset the flip-flops 20 of all switch cells of the Nth column.

BROADCAST: The broadcast command includes an operand referencing a particular row address M and tells decoder 27 to configure the crosspoint switch array to broadcast the Mth input signal to all output terminals by setting flip-flops 24 of all switch cells of the Mth array row and resetting flip-flops 24 of all other switch cells.

Switch Array Controller

Figure 5:
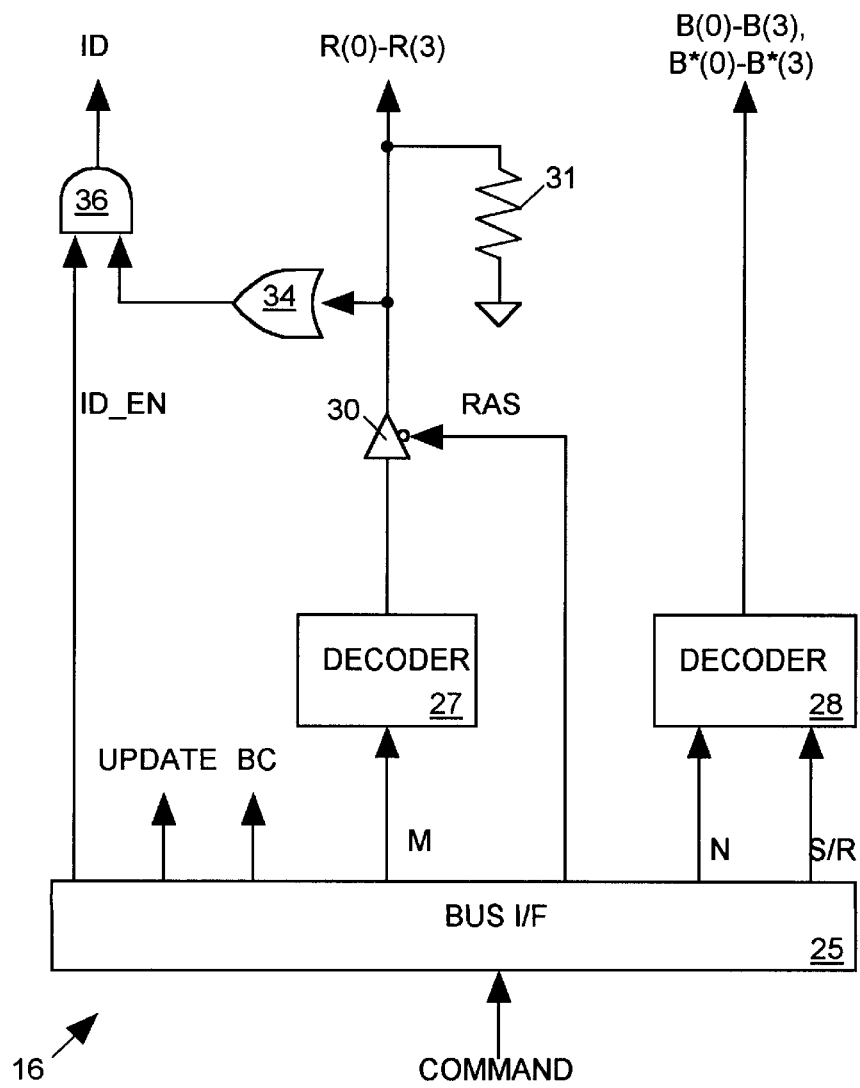
FIG. 5 illustrates the controller of the crosspoint switch of FIG. 3 in more detailed block diagram form.

FIG. 5 illustrates crosspoint switch array controller 16 of FIG. 3 in more detailed block diagram form. Controller 16 includes a serial or parallel bus interface circuit 25 for receiving incoming commands and decoding their opcodes. Bus interface circuit 25 delivers the row and column address fields M and N of incoming write, qwrite, write_id and qwrite_id command operands to a pair of decoders 27 and 28. Decoder 27 decodes the row address and drives an appropriate one of row address lines R(0)–R(3) high via a set of four tristate buffers 30. Decoder 28 decodes the command's column address field N and set/reset control bit S/R to drive one of bit lines B(0)–B(3) or B*(0)–B*(3) high. A set of four pull-down resistors 31 weakly pull row address lines R(0)–R(3) low when tristate buffers 30 are inactive. However with a short delay sufficient to permit decoders 27 and 28 to decode the row and column address fields, bus interface circuit 25 pulses a row address strobe signal (RAS) to enable tristate buffers 30. One of the buffers then produces a pulse on the Mth row address line R(M), thereby causing the addressed switch cell S(M,N) to set or reset its internal flip-flop 20 in the manner indicated by the bit line states. For quick write commands (qwrite and qwrite_id), bus interface 24 shortly thereafter pulses the UPDATE signal to tell all switch cells to set their flip-flops 24 to match the states of their flip-flops 20.

An OR gate 34 ORs the row address lines to provide an input to an AND gate 36 which asserts the implied disconnect control signal ID during implied disconnect write operations. When responding to implied disconnect commands (write_id and qwrite_id), bus interface circuit 25 asserts an enable signal (ID_EN) driving a second input of AND gate 36, thereby permitting AND gate 36 to assert the ID signal when any one of the row address lines R(0)–R(3) is asserted.

Bus interface circuit 25 responds to a broadcast command by routing the row address field M of the command to decoder 27 and strobing both the RAS signal driving tristate buffers 30 asserting the broadcast control signal BC input to all switch cells.

Bus interface circuit 24 responds to UPDATE commands simply by pulsing the UPDATE control signal.

Summary

The crosspoint switch cell array 14 has several advantages over the prior art. The use of two memory cells instead of one in every switch cell allows array controller 16 to write a new routing pattern to the first memory cells over several write cycles, and then to simultaneously update the entire routing pattern in a single write cycle. In contrast, controller 12 handling prior art array 10 of FIG. 2 must issue a separate write command to change the actual switching state of each cell in turn, and that can lead to problematic intermediate switch array routing configurations in some applications.

Also, when operating in the implied disconnect mode, the array controller needs only a single array write cycle to break an existing path to any output terminal and to make a new path to it. The prior art array 10 needs two write cycles to carry out the same make/break operation, one to break the original path and one to make the new path.

In the broadcast mode of operation, controller 16 uses a single write operation to break existing signal routes and to configure the array for broadcasting. Since the data describing the previous routing pattern remains in the first memory cells, to restore array 14 to that previous pattern controller 16 needs only a single write cycle to pulse the UPDATE signal. For the prior art array controller 12 to broadcast a signal it must conduct successive sequences of write operations to both broadcast the signal and restore the original array configuration. The prior art array 10 loses all knowledge of the previous routing pattern when it is configured for a broadcast. Therefore a host computer would have to remember that configuration and command the array controller to restore it. The restoration process could require many write cycles.

Although the invention has been described within the context of a 4×4 array, those skilled in the art will recognize that the crosspoint switch architecture disclosed herein can be easily scaled up to implement crosspoint switches of large dimensions.

While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. A switch cell for a crosspoint switch array, wherein the crosspoint switch array routes input signals between a plurality of input lines and a plurality of output lines, wherein the switch cell responds to input control signals by selectively providing a signal path between one input line and one output line of the crosspoint switch array, and wherein the switch cell comprises:

a first memory cell for storing a data bit, a second memory cell for storing a control bit, first means for setting the data bit stored in the first memory cell to a state indicated by the input control signals and for setting the control bit stored in the second memory cell to a state determined by the state of the data bit stored in the first memory cell in response to the input control signals, and second means for selectively making and breaking the signal path between the input line and the output line in accordance with the state of the control bit stored in the second memory cell.

2. The switch cell in accordance with claim 1 wherein said first means alternatively sets the control bit stored in said second memory cell to a state referenced by said control signals.

3. The switch cell in accordance with claim 1 wherein each of said first memory cell and said second memory cell comprises a flip-flop.

4. An N×M crosspoint switch array for making and breaking signal paths between M input terminals and N output terminals in response to input commands, wherein M and N are integers greater than one, the crosspoint switch array comprising:

a plurality of switch cells;

controller means for transmitting control signals to the switch cells in response to the input commands;

M input lines, each coupled to a separate one of said input terminals; and

N output lines, each coupled to a separate one of said output terminals, wherein each switch cell is connected to a corresponding one of said input lines and a corresponding one of said output lines and comprises:

a first memory cell for storing a data bit;

a second memory cell for storing a control bit;

first means for setting the data bit stored in the first memory cell to a state indicated by the control signals, and for setting the control bit stored in the second memory cell to a state determined by the state of the control bit stored in the first memory cell in response to the control signals; and second means for selectively making and breaking a signal path between the input line and the output line in accordance with a state of the control bit stored in the second memory cell.

5. The N×M crosspoint switch array in accordance with claim 4 wherein said first means alternatively sets the control bit stored in said second memory cell to a state referenced by said control signals.

6. The N×M crosspoint switch array in accordance with claim 4 wherein each of the first memory cell and the second memory cell of each switch cell comprises a flip-flop.

7. The N×M crosspoint switch array in accordance with claim 4 wherein said plurality of control signals comprises an UPDATE signal transmitted concurrently to all of said switch cells, wherein the UPDATE signal signals the first means of each switch cell to set the control bit stored in the second memory cell to a state determined by the state of the data bit stored in the first memory cell.

8. The N×M crosspoint switch array in accordance with claim 4 wherein said plurality of switch cells include M rows and N columns of switch cells, each row of switch cells corresponding to a separate one of the N input lines and each column of switch cells corresponding to a separate one of the M output lines.

9. The N×M crosspoint switch array in accordance with claim 8 wherein said control signals comprise:

M row address signals, each being transmitted to all switch cells of a corresponding one of said M rows of switch cells;

M implied disconnect signals, each being transmitted to all switch cells of a corresponding one of said M rows of switch cells; and N bit signal pairs, each bit signal pair being transmitted to all switch cells of a corresponding one of said N columns of switch cells, wherein the first means of each switch cell sets the state of the data bit stored in the switch cell's first memory cell to a state indicated by the bit signal pair transmitted to the switch cell in response to a pulse of the row address signal transmitted to the switch cell, and wherein the first means of each switch cell sets the state of the data bit stored in the switch cell's first memory cell to a state opposite to a state indicated by the bit signal pair transmitted to the switch cell in response to a pulse of the implied disconnect signal transmitted to the switch cell.

10. The N×M crosspoint switch array in accordance with claim 9 wherein said plurality of control signals comprises an UPDATE signal transmitted concurrently to all of said switch cells, wherein the UPDATE signal signals the first means of each switch cell to set the control bit stored in the second memory cell to a state determined by the state of the data bit stored in the first memory cell.

11. The N×M crosspoint switch array in accordance with claim 7 wherein said control signals comprise:

M row address signals, each being transmitted to all switch cells of a corresponding one of said M rows of switch cells, N bit signal pairs, each bit signal pair being transmitted to all switch cells of a corresponding one of said N columns of switch cells, wherein the first means of each switch cell sets the state of the data bit stored in the switch cell's first memory cell in accordance with a state indicated by the bit signal pair transmitted to the switch cell in response to a pulse of the row address signal transmitted to the switch cell.

12. The N×M crosspoint switch array in accordance with claim 11 wherein said plurality of control signals comprises an UPDATE signal transmitted concurrently to all of said switch cells, where in the UPDATE signal signals the first means of each switch cell to set the control bit stored in the second memory cell to a state determined by the state of the data bit stored in the first memory cell.

13. The N×M crosspoint switch array in accordance with claim 11 wherein said plurality of control signals comprises a broadcast signal transmitted concurrently to all of said switch cells, wherein when the control means concurrently transmits the broadcast signal and one of said row address signals to any one of the switch cells, the first means of the switch cell sets the control bit stored in the switch cell's second memory cell to a first state, and wherein when the control means transmits the broadcast signal without concurrently transmitting one of said row address signals to any one of the switch cells, the first means of the switch cell sets the control bit stored in the switch cell's second memory cell to a second state.

* * * * *